United States Patent [19]

Binnie

[11] Patent Number: 5,438,255

[45] Date of Patent: Aug. 1, 1995

[54] HIGH VOLTAGE PHASING DETECTOR

[75] Inventor: Alexander J. Binnie, Scotland, United Kingdom

[73] Assignee: Edgcumbe Instruments Limited, West Sussex, England

[21] Appl. No.: 227,656

[22] Filed: Apr. 14, 1994

[30] Foreign Application Priority Data

Apr. 17, 1993 [GB] United Kingdom ............... 9307973

[51] Int. Cl.⁶ ............................................. G01R 27/28
[52] U.S. Cl. ........................................ 324/87; 324/678; 327/2
[58] Field of Search ............... 324/678, 76, 77, 87; 327/2, 3, 77, 365

[56] References Cited

U.S. PATENT DOCUMENTS

| | | | |
|---|---|---|---|
| 2,989,698 | 6/1961 | Bennett | 324/87 |
| 4,547,683 | 10/1985 | Bingham | 327/3 |
| 4,922,402 | 5/1990 | Olivo et al. | 327/365 X |
| 5,204,674 | 4/1993 | Holben | 324/678 X |
| 5,343,157 | 8/1994 | Deschamps | 324/678 |

FOREIGN PATENT DOCUMENTS 1102783 2/1968 United Kingdom .

*Primary Examiner*—Kenneth A. Wieder
*Assistant Examiner*—Glenn W. Brown
*Attorney, Agent, or Firm*—David P. Gordon

[57] ABSTRACT

A detector for determining the phase of high AC voltages comprises two inputs for connecting to respective probes which contact the conductors to be tested, a rectifier circuit to which the inputs are connected, a chain of capacitors arranged to be charged in series from the output of the rectifier circuit, an operational amplifier configured as a trip amplifier for providing an output signal when the output voltage of the rectifier exceeds a predetermined value, and a transistor for discharging the capacitors in parallel through a buzzer and a chain of light emitting diodes when the output signal is provided.

13 Claims, 1 Drawing Sheet

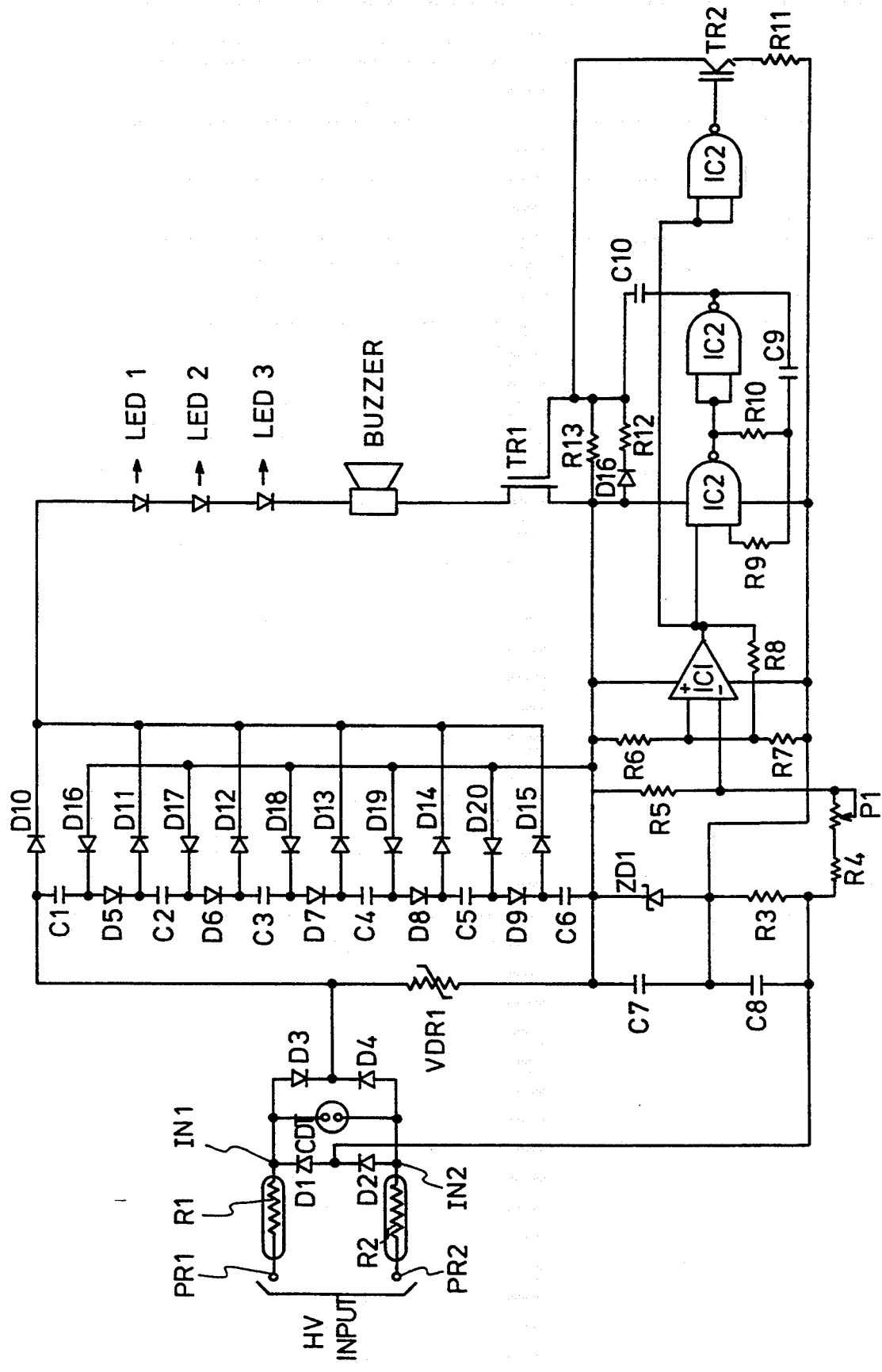

HIGH VOLTAGE PHASING DETECTOR

BACKGROUND OF THE INVENTION

This invention relates to a high voltage phasing detector, namely an instrument to determine whether the voltages on two conductors are in phase.

Such instruments are used, for example, to check phasing across switchgear and bus-bars after maintenance. The instruments comprise two resistors contained in insulating rods: one end of each rod has a contact probe, for contact with the conductors to be tested. The other ends of the rods are connected together via an insulated conductor and a detector, either in the form of an analog meter or an indicator such as a neon or light emitting diode. If the two conductors which the two probes contact are in phase, then no current flows and the detector reads zero (if it is an analog meter), or does not illuminate (if it is a neon or LED). However, if the two conductors are out of phase, the detector will give a reading (if it is an analog meter) or it will illuminate (if it is a neon or LED).

Under new standards to be introduced, a current of only 0.75 mA is available when the two conductors under test are out of phase. This current is sufficient to illuminate neons, but generally neons give poor illumination and are not particularly reliable. Light emitting diodes give good illumination, but require a relatively high current, typically 10 mA. Neither neons nor LED's have a precise switching point. It is possible to include a battery-driven arrangement in the instrument to provide a precise switching point, but this has the disadvantage that the battery must be replaced when discharged and further a circuit is required to detect when the battery is discharged.

We have now devised a high voltage phasing detector which overcomes these difficulties.

SUMMARY OF THE INVENTION

In accordance with this invention, there is provided a detector having two inputs for connection to respective probes for contacting a pair of conductors to be tested, a rectifier circuit to which said inputs are connected, a plurality of capacitors arranged to be charged in series from the output of said rectifier circuit, threshold means for providing an output signal when the output voltage of said rectifier circuit exceeds a predetermined value, and means for discharging said capacitors in parallel through an indicator means when said output signal is provided.

The indicator means may comprise a light emitting device (e.g. one or more LED's) and/or a sound emitting device. It will be appreciated that the charge and discharge arrangement of the capacitors effectively provides a DC stepdown transformer, having a high voltage, low current input and providing a low voltage, high current output suitable for energizing an indicator device.

Preferably the capacitors are charged and discharged alternately. For example, the detector may include an oscillator which is enabled when the rectifier output exceeds its predetermined value, to alternately open and close a switch (preferably an FET) in a discharge path through the indicator means. Preferably in response to said output signal ceasing (in consequence of the input voltage to the detector falling below a given level), a further switch is turned on to open the main discharge switch immediately.

Preferably a supply voltage is derived from the rectifier output, for an electronic circuit, which includes e.g. the threshold means and the oscillator. The threshold means preferably comprises an operational amplifier configured as a trip amplifier, the trip point of which is preferably adjustable. The input for the threshold means is preferably developed across a resistor connected in series with the capacitors across the rectifier circuit, and is therefore proportional to the voltage between the inputs of the detector. The supply voltage is preferably developed across a zener diode connected in series with the capacitors across the rectifier circuit.

Preferably a first set of diodes are connected in series with the capacitors, a said diode being connected between each pair of capacitors. Preferably a second set of diodes is connected between one side of respective said capacitors and one end of a discharge path, and a third set of diodes is connected between the opposite side of respective said capacitors and the other end of the discharge path. The first set of diodes are poled to provide a series charging path through the capacitors, from the output of the rectifier circuit. The second and third set of diodes are poled to provide a parallel connection of the capacitors across the discharge path.

An embodiment of this invention will now be described by way of example only.

BRIEF DESCRIPTION OF THE DRAWINGS

FIG. 1 is a circuit diagram of a high voltage phasing detector in accordance with this invention.

DETAILED DESCRIPTION OF THE PREFERRED EMBODIMENT

Referring to FIG. 1, there is shown a detector having two inputs IN1, IN2 connected or connectable to resistors R1, R2 which are contained in insulating rods. At their opposite end the rods are provided with probes PR1, PR2 for contacting the conductors to be tested. The detector includes a rectifier bridge across which the two inputs of the detector are connected, the rectifier bridge comprising diodes D1 to D4. The detector further comprises a chain of capacitors C1 to C6 and diodes D5 to D9 connected in series with a zener diode ZD1 and a resistor R3 across the output of the rectifier bridge. A regulated supply is taken from across the zener diode, for an electronic circuit which includes integrated circuits IC1 and IC2. The rectified output of the bridge charges the capacitors C1 to C6 and provides a voltage across resistor R3, proportional to the input voltage. Capacitors C7 and C8 are connected across the zener diode ZD1 and the resistor R3 to provide decoupling. A voltage dependent resistor VDR1 is connected in parallel with the series chain of capacitors C1 to C6 and diodes D5 to D9, to limit the voltage across these capacitors. A gas discharge tube GDT is connected across the input to the rectifier bridge to provide suppression against the effects of sparking.

IC1 is a low power operational amplifier which, together with resistors R4, P1, R5, R6 and R8, acts as a trip amplifier, the output of which goes high when the voltage across the two probes PR1, PR2 exceeds a predetermined level, adjusted at P1: typically this will be set to either 3.3 kV or 9.9 kV.

Two NAND gate of IC2 are interconnected with resistors R9 and R10 and a capacitor C9 to form a multivibrator, which is enabled when the output of trip amplifier IC1 goes high. The multivibrator then oscillates at e.g. 1 Hz with e.g. unity mark-space ratio. The output of the multivibrator is coupled by a capacitor C10 to the gate of a MOS-FET TR1 which is connected in series with indicator LED's 1 to 3 and a buzzer across the capacitor/diode chain C1 to C6/D5 to D9. Accordingly, when the multivibrator starts oscillating, the MOS-FET TR1 is switched on and off in synchronism with it. A series circuit R12, D16 and parallel resistor R13 are connected between the gate and drain of MOS-FET TR1 to provide a fast discharge path.

Diodes D10 to D15 are connected between the cathodes of respective diodes D5 to D9 and one end of the LED/MOS-FET series circuit. Diodes D16 to D20 are connected between the anodes of diodes D5 to D9 and the other end of the LED/MOS-FET series circuit. Accordingly, each time MOS-FET TR1 switches on, the capacitors C1 to C6 discharge, via diodes D10 to D20, through LED's 1 to 3 and the buzzer. It will be appreciated that the capacitors C1 to C6 are charged in series whilst MOS-FET TR1 is off (and typically to a voltage of 90 volts across the chain), and then for discharge when TR1 is on, the capacitors C1 to C6 are effectively connected in parallel (applying a discharge voltage of 15 volts across the LED/MOS-FET circuit). Each time MOS-FET TR1 switches off, the capacitors C1 to C6 charge through diodes D5 to D9, diodes D10 to D20 being either reversed biassed or blocked by the nonconducting MOS-FET TR1.

By charging the capacitors C1 to C6 in series and discharging them in parallel, the arrangement acts as a DC step-down transformer, with an input of typically 90 volts at 0.75 mA and an output of 15 volts at 4.5 mA.

A third NAND gate of IC2 is connected between the output of the trip amplifier IC1 and the base of a transistor TR2, which has its collector connected to the gate of MOS-FET TR1 and its emitter connected via resistor R11 to the ground rail of the regulated supply. When the output of trip amplifier IC2 goes low, the transistor TR2 is switched on and so switches off MOS-FET TR1. This circuit therefore ensures that the LED's 1 to 3 and the buzzer are switched off immediately when the input voltage to the instrument drops below the preset threshold (of typically 3.3 kV or 9.9 kV).

I claim:

1. A detector having two inputs for connection to respective probes for contacting a pair of conductors to be tested, a rectifier circuit to which said inputs are connected, a plurality of capacitors arranged to be charged in series from the output of said rectifier circuit, threshold means for providing an output signal when the output voltage of said rectifier circuit exceeds a predetermined value, an indicator means for indicating whether the voltages on said conductors are in phase, and means for discharging said capacitors in parallel through said indicator means when said output signal is provided.

2. A detector as claimed in claim 1, in which said indicator means comprises a light emitting means.

3. A detector as claimed in claim 1, in which said indicator means comprises a sound emitting means.

4. A detector as claimed in claim 1, comprising means arranged to alternately charge and discharge said capacitors.

5. A detector as claimed in claim 4, comprising switching means, and an oscillator enabled when said rectifier output exceeds said predetermined value and arranged to open and close said switching means, said switching means being connected in a discharge path through said indicator means.

6. A detector as claimed in claim 5, comprising a further switching means arranged to be turned on when said output signal ceases, to open the switching means in said discharge path.

7. A detector as claimed in claim 1, comprising means to derive a supply voltage from the rectifier output.

8. A detector as claimed in claim 1, in which said threshold means comprises an operational amplifier configured as a trip amplifier.

9. A detector as claimed in claim 8, in which the trip amplifier has an adjustable trip point.

10. A detector as claimed in claim 1, comprising a resistor connected in series with said capacitors across the rectifier circuit, the input for said threshold means being developed across said resistor.

11. A detector as claimed in claim 1, comprising a zener diode across which a supply voltage is developed, said zener diode being connected in series with said capacitors across the rectifier circuit.

12. A detector as claimed claim 1, in which a first set of diodes are connected in series with said capacitors, a diode of said first set being connected between each adjacent pair of said capacitors.

13. A detector as claimed in claim 12, comprising a second set of diodes connected between one side of respective said capacitors and one end of a discharge path, and a third set of diodes connected between the opposite side of respective said capacitors and the other end of the discharge path.

* * * * *